United States Patent
Levi et al.

(10) Patent No.: US 6,363,519 B1
(45) Date of Patent: Mar. 26, 2002

(54) METHOD AND APPARATUS FOR TESTING EVOLVABLE CONFIGURATION BITSTREAMS

(75) Inventors: Delon Levi, Sunnyvale, CA (US); Steven A. Guccione, Austin, TX (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 09/335,422

(22) Filed: Jun. 17, 1999

Related U.S. Application Data

(60) Provisional application No. 60/122,161, filed on Feb. 26, 1999.

(51) Int. Cl.[7] .................. G06F 17/50; G06F 15/177

(52) U.S. Cl. .................. 716/16; 716/18; 716/4; 709/203; 709/217; 709/221; 713/1; 713/100

(58) Field of Search .................. 716/1–21; 709/201–203, 709/217–222; 713/1–2, 180

(56) References Cited

U.S. PATENT DOCUMENTS

| | | | |
|---|---|---|---|
| 5,784,577 A | * 7/1998 | Jacobson et al. | 710/104 |
| 5,794,033 A | * 8/1998 | Aldebert et al. | 713/100 |
| 5,864,486 A | * 1/1999 | Deming et al. | 716/17 |
| 5,995,744 A | * 11/1999 | Guccione | 703/23 |
| 6,023,565 A | * 2/2000 | Lawman et al. | 716/1 |
| 6,035,106 A | * 3/2000 | Carruthers et al. | 703/1 |
| 6,052,720 A | * 4/2000 | Traversat et al. | 709/220 |
| 6,078,735 A | * 6/2000 | Baxter | 716/3 |
| 6,078,736 A | * 6/2000 | Guccione | 716/16 |
| 6,099,583 A | * 8/2000 | Nag | 716/16 |
| 6,102,963 A | * 8/2000 | Agrawal | 716/17 |
| 6,134,516 A | 10/2000 | Wang et al. | |
| 6,161,125 A | * 12/2000 | Traversat et al. | 709/203 |
| 6,167,364 A | * 12/2000 | Stellenberg et al. | 703/19 |
| 6,216,258 B1 | * 4/2001 | Mohan et al. | 716/17 |

(List continued on next page.)

FOREIGN PATENT DOCUMENTS

| | | |
|---|---|---|
| EP | 0 657 832 A | 6/1995 |
| WO | WO 98 19256 A | 5/1998 |
| WO | WO 00 38087 A | 6/2000 |

OTHER PUBLICATIONS

Levi D and Guccione S. A.: "GeneticFPGA: A Java–Based Tool for Evolving Stable Circuits", Part of the SPIE Conference on Reconfigurable Technology: FPGAs for Computing Applications, vol. 3844, Sep. 1999 pp. 114–121, Boston USA.

(List continued on next page.)

*Primary Examiner*—Matthew Smith
*Assistant Examiner*—Phallaka Kik
(74) *Attorney, Agent, or Firm*—Edel M. Young; Scott R. Brown, Esq.

(57) ABSTRACT

A system and method for evolving configuration bitstreams for a programmable logic device are disclosed. A plurality of data structures having respective sets of data are established. From the sets of data, respective configuration bitstreams are generated, wherein the sets of data are mapped to positions in the bitstreams. The configuration bitstreams are then evaluated for relative suitability to meet predetermined criteria when deployed on a programmable logic device. From the relative suitability of the configuration bitstreams, next-generation data for the data structures are generated using a genetic algorithm applied to sets of data. In the various embodiments, the configuration bitstreams eliminate resource contentions, selectively eliminate asynchronous behavior, include built-in test circuits, and are relocatable. Multiple populations of configuration bitstreams can evolve in parallel over a network.

23 Claims, 7 Drawing Sheets

U.S. PATENT DOCUMENTS

| | | | |
|---|---|---|---|
| 6,237,029 B1 | | 5/2001 | Master et al. |
| 6,243,851 B1 | * | 6/2001 | Hwang et al. ................. 716/10 |
| 6,272,669 B1 | * | 8/2001 | Anderson et al. ............. 716/16 |
| 6,279,146 B1 | * | 8/2001 | Evans et al. .................. 716/18 |
| 6,301,695 B1 | * | 10/2001 | Burnham et al. ............. 716/16 |

OTHER PUBLICATIONS

Kitano H. et al.: "Evolvable Hardware with Development", IEEE International Symposium on Circuits and Systems (ISCAs), U.S. New York, IEEE May 12, 1996, pp. 33–36.

Popp R.L. et al.: "Automated Hardware Design Using Genetic Programming, VHDL, and FPGAs", 1998 IEEE International Conference on Systems, MAN and Cybernetics, vol. 3, Oct. 11–14, 1998 pp. 2184–2189, San Diego USA.

Thompson A: "Silicon Evolution", Proceedings of Genetic Programming 1996 Conference, Jul. 28–31 1996, pp. 444–452, Stanford USA.

Miller J.F. et al.: "Designing Electronic Circuits Using Evolutionary Algorithms. Arithmetic Circuits: A Case Study", Genetic Algorithms and Evolution Strategies in Engineering and Computer Science: Recent Advancements and Industrial Applications, EDS: D. Chapter 6, Quagliarella et al, 1997.

Guccione S. A. et al: "JBits: A Java–Based Interface to FPGA Hardware" undated document retrieved on Dec. 11, 2000 for WWW at http://www.io.com/~guccione/Papers/Papers.html, earlier version published Nov. 1998.

Adrian Thompson, "Silicon Evolution," Proceedings of Genetic Programming 1996 (GP96), J.R. Koza et al. (Eds), pp. 444–452, MIT Press 1996.

* cited by examiner

METHOD AND APPARATUS FOR TESTING EVOLVABLE CONFIGURATION BITSTREAMS

RELATED PATENT APPLICATIONS

The present application claims priority to U.S Provisional Application No. 60/122,161 entitled "Method and Apparatus for Evolving Configuration Bitstreams which was filed Feb. 26, 1999.

This application also relates to the following commonly owned U.S. Patent Applications, all filed on the same day as this application, and all incorporated herein by reference:

Ser. No. 09/335,862, entitled "METHOD AND APPARATUS FOR EVOLVING CONFIGURATION BITSTREAMS" invented by Delon Levi and Steven A. Guccione Ser. No. 09/335,437, entitled "METHOD AND APPARATUS FOR RELOCATING ELEMENTS IN AN EVOLVABLE CONFIGURATION BITSTREAM" invented by Delon Levi and Steven A. Guccione Ser. No. 09/336,423, entitled "METHOD AND APPARATUS FOR EVOLVING A PLURALITY OF VERSIONS OF A CONFIGURATION BITSTREAM IN PARALLEL" invented by Delon Levi and Steven A. Guccione Ser. No. 09/335,424, entitled "METHOD AND APPARATUS FOR REMOTELY EVOLVING CONFIGURATION BITSTREAMS" invented by Delon Levi and Steven A. Guccione

FIELD OF THE INVENTION

The present invention generally relates to genetic algorithms and evolvable hardware, and more particularly to a method for evolving configuration bitstreams for programmable logic devices.

BACKGROUND

Many conventional design methodologies are based on a structured design approach. That is, high-level requirements are partitioned, perhaps hierarchically, into lower-level requirements. Teams of engineers are assigned to create designs and sub-designs that meet the requirements at the different levels. The structured design methodology is advantageous because it supports building on past experiences in addressing similar types of requirements, thereby promoting development of an effective design in an efficient manner. However, a drawback to traditional design methods is that the same experiences that promote quickly satisfying a requirement may blind engineers to alternative, and perhaps better, solutions.

Work is presently underway to fundamentally change the way in which designs are created. The new methodology uses principles of natural selection from the biological world to create electronic hardware designs. The process is often characterised as "evolvable hardware" or using genetic algorithms to create hardware designs. In an example process of evolving a design, a population of designs is first randomly created, tested, and scored based on the suitability to meet the design requirements. Then based on natural selection principles, certain ones of the designs in the population are selected to "reproduce," that is, used to create new designs for the population. The process of testing, scoring, and reproducing is then repeated until a suitable design has evolved.

The hardware used in evolving designs is typically some type of programmable logic device. SRAM FPGAs are suitable because they can be programmed, tested, and reprogrammed many times in evolving a design. The XC6200 FPGA from XILINX has been often used for the additional reason that the architecture does not allow contention in the device, no matter what the bitstream is.

A problem often encountered with evolving designs for other SRAM FPGA architectures is that the objective designs are usually intended to be digital solutions for digital devices (e.g., a bitstream for an FPGA), but an evolved design can cause a digital device to exhibit unintended asynchronous behavior and even contain contentions for resources capable of destroying the device. For example, widely used commercial parts, such as the XC4000EX/XL and Virtex FPGAs from XILNX, can be damaged if multiple signals are allowed to drive the same wire. Thus, such parts have been avoided for evolving hardware.

At present, testing the evolving circuits is very time consuming. Many hours are spent reading and writing configuration bitstreams and testing the fitness of the bitstreams. Some implementations use dedicated input/output ports for probing the evolving designs. However, dedicating input/output ports to testing limits the portability of the design. Further, setting up the hardware for a test procedure is expensive. A test system board must include several IC devices for performing the tests, and these IC devices may not be configurable. If these non-configurable IC devices do not perform properly with an evolved design, the tests may not be valid or useful, and the hardware may have to be changed.

Today's evolved circuits tend to be suitable for implementation on specific devices. Irregularities in device fabrication, operating temperature, operating voltage, and other environmental factors can affect a circuit's performance, and thus, its fitness. Therefore, an evolved circuit is rarely suitable for implementation on a variety of devices.

A method that address the aforementioned problems, as well as other related problems, is therefore desirable.

SUMMARY OF THE INVENTION

The purpose of including test circuits in the FPGA design is to drive test data to the evolved design and collect data from the design in order to evaluate the evolved circuit. The invention provides a method and apparatus for evolving configuration bitstreams having built-in test circuits. These test circuits can take test data from other devices or programs and apply the data to the evolved circuit under test.

In one embodiment, a method is provided for evolving configuration bitstreams for a programmable logic device. The method comprises providing a test circuit to be implemented on the programmable logic device. A population of configuration bitstreams is created, wherein each bitstream implements the test circuit and has a selected portion that is evolvable. The respective selected portions of the configuration bitstreams are evolved until at least one predetermined criterion is met.

In another method, a test circuit is provided to be implemented on the programmable logic device. Chromosome data structures are established having data associated with programming resources of the programmable logic device, and respective configuration bitstreams are created from data of the chromosome data structures and the test circuit. The respective configuration bitstreams that include the test circuit are evaluated for relative suitability to meet predetermined criteria when deployed on a programmable logic device, and the chromosome data structures are evolved until at least one predetermined criterion is met.

In another embodiment an apparatus is provided. The apparatus comprises: means for providing a test circuit to be implemented on the programmable logic device; means for establishing chromosome data structures having data associated with programming resources of the programmable logic device; means for creating respective configuration bitstreams from data of the chromosome data structures and the test circuit; means for evaluating the respective configuration bitstreams that include the test circuit for relative suitability to meet predetermined criteria when deployed on a programmable logic device; and means for evolving data in the chromosome data structures based on the relative suitability until at least one predetermined criterion is met.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings in which:

FIGS. 9a and 9b show flip flop values that are inconsistent due to asynchronous behavior.

FIGS. 9c and 9d show flip flop values that agree due to prohibiting asynchronous behavior.

Figure 1A:
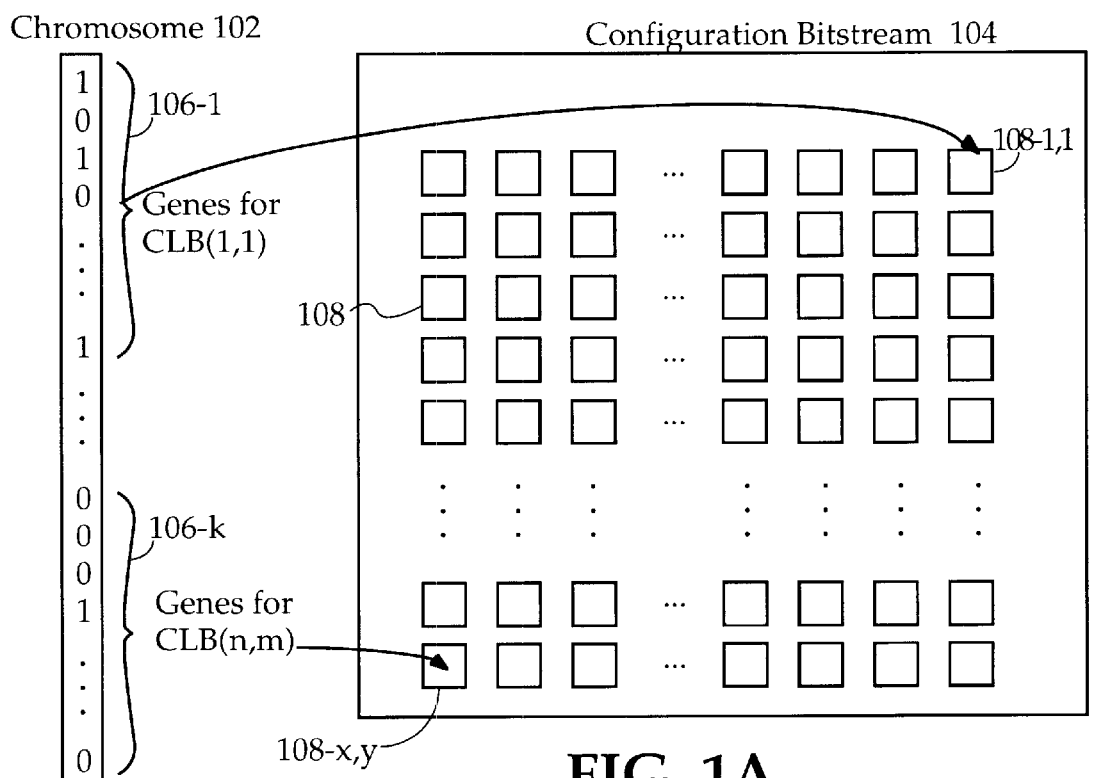
FIG. 1A is a block diagram that illustrates the relationship between a chromosome and a configuration bitstream.

Specific embodiments of the invention have been shown by way of example in the drawings and will herein be described in detail. However, the intent is to cover all modifications, equivalents, and alternatives falling within the spirit and scope of the invention as defined by the appended claims.

DETAILED DESCRIPTION

The present invention is believed to be applicable to a variety of methods and apparatus for evolving configuration bitstreams for programmable logic devices (PLDs). The present invention has been found to be particularly applicable and beneficial for evolving configuration bitstreams for FPGAS. While the present invention is not so limited, an appreciation of the present invention is presented by way of specific examples involving FPGAs.

In an example embodiment of the invention, data structures called chromosomes are used to create configuration bitstreams (the "designs" or "circuits" implemented) for an FPGA. The chromosome is comprised of a plurality of bits that represent "genetic" codes which map to programmable resources in an FPGA. Thus, each programmable resource in the evolving design has an associated gene on the chromosome, and a configuration bitstream can be constructed from the genetic codes. Note that even though a chromosome is used to create a configuration bitstream, a chromosome does not have to specify a complete bitstream. Other chromosomes and other non-evolvable logic may also be incorporated in a bitstream.

FIG. 1A is a block diagram that illustrates the relationship between chromosome 102 and configuration bitstream 104. Chromosome 102 is comprised of a plurality of sets of genes 106-1–106-k, and configuration bitstream 104 is comprised of a plurality of bit sequences 108 represented as blocks. Each of bit sequences 108 in configuration bitstream 104 corresponds to bits used to program resources in a respective CLB in an FPGA, and each of gene sets 106-1 through 106-k corresponds to a respective one of bit sequences 108. For example, genes in set 106-1 map to bit sequence 108-1, and the genes of set 106-k map to bit sequence 108-n,m. In other words, the bits in a gene are translated into programming bits in configuration bitstream 104, wherein the location is determined by the CLB and resource with which the gene is associated.

From the specific example embodiment of FIG. 1A, various other embodiments will be appreciated. Specifically, chromosome 102 may map to only a subset of CLBs for an FPGA, wherein CLBs for which no genes are provided (the "non-evolving CLBs") have predetermined programming. For example, the non-evolving CLBs may implement previously developed designs or test circuits, or, alternatively, may not be used at all.

Designs for various other programmable logic devices, for example, programmable array logic devices (PALs) and programmable logic arrays (PLAs), could also be evolved using the techniques of the present invention. For such cases, genes 106-1 through 106-k of chromosome 102 could be adapted to program the resources of the chosen device, and bit sequences 108 would correspond to the resources to be programmed.

Some devices, such as the XC4000EX/XL and Virtex FPGAs, have been avoided for use in evolving hardware because of the possibility of damaging or destroying the device. Damage from contention can result if multiple signals are permitted to drive a single wire, some with logic high signals and others with logic low signals. These devices function properly if the designer, or the software used by the designer, has resolved all contentions. However, with evolvable hardware, there exists the possibility that a design exhibiting such contentions may evolve.

The problem of contention can be addressed in at least four different ways.

In a first embodiment, an evolved bitstream can be analyzed to determine whether it produces conflicts for resources. If contention for a resource is detected, connections are changed in the bitstream to eliminate the contention.

In a second embodiment, signal lines are predefined in a "null" bitstream as being connected to respective drivers. The chromosomes do not have genes associated with the predefined connections, and therefore, contentions are prevented from evolving. Connectivity, however, can be evolved with mutations of genes associated with inputs fed by the drivers.

In a third embodiment, only wires that have a single driver attached to the wire are allowed to be used for the evolving circuit. The single driver is always turned on, and thus inputs to drivers are never floating. For an FPGA, programmable resources within a CLB are generally permitted to evolve. However, in this third embodiment, only direct connect wires that link adjacent CLBs are evolvable. All signal lines that can be driven by multiple outputs, for example, long lines, quad-length lines, and single length lines, are disabled by bits in the configuration bitstream. Thus, evolution of a chromosome does not affect the disabled lines. This embodiment is limiting for some architectures, for example the new XC4000, the XC5200, and the XCV000 device families available from Xilinx, Inc., because the longer length lines can not be used since these longer length lines can be driven from several sources (several CLBs), and thus contention is more difficult to control. Evolution of designs for other PLD architectures having comparable signal lines can be treated similarly.

In a fourth embodiment, to eliminate contention, assignments of resources (e.g., signal lines to drivers) are tracked. When a contentious assignment is attempted, another resource is assigned.

If allowed to evolve without limitation, a design can cause a PLD to exhibit asynchronous behavior. For example, XILNIX FPGAs have programmable asynchronous set/reset ports on some flip-flops. Thus, a bitstream could evolve to programmably enable the asynchronous set/reset, even though the behavior is undesirable.

In one embodiment, the method of the invention prevents the evolution of PLD circuits that exhibit asynchronous behavior. Asynchronous behavior can be eliminated, for example, by constructing chromosomes to evolve only for those resources which cannot produce asynchronous behavior, and fixing bits in the configuration bitstream to force or disable selected programmable resources that could produce asynchronous behavior. For example, the asynchronous set/reset ports of flip-flops are disabled in the configuration bitstream, and the chromosomes do not include genes for evolving programming of the asynchronous set/reset ports.

Figure 1B:
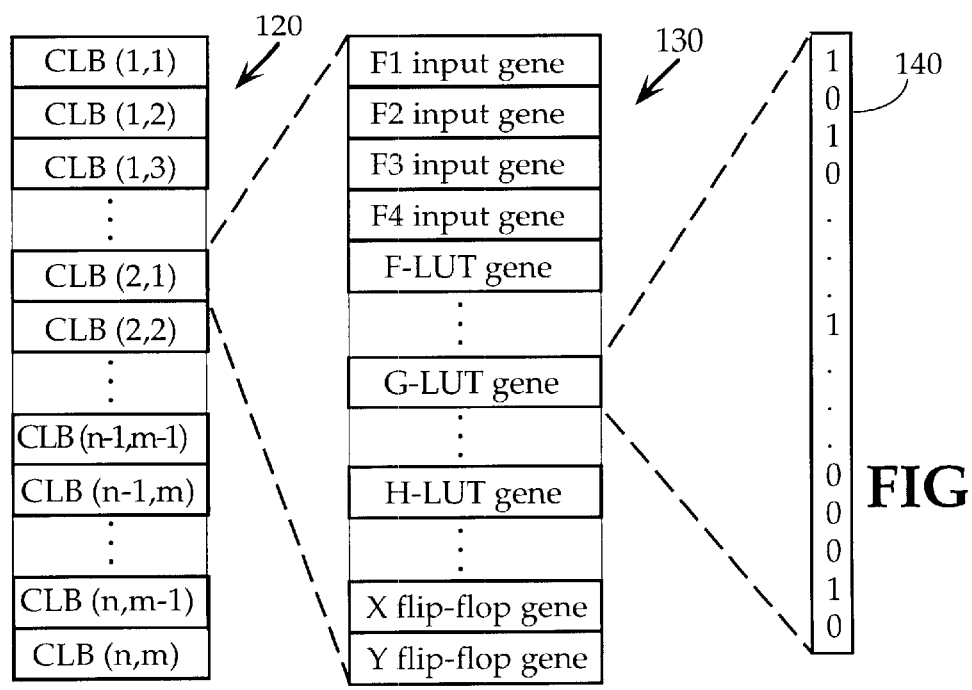
FIG. 1B further illustrates the hierarchical relationship between chromosomes and genes.

FIG. 1B further illustrates the hierarchical relationship between chromosomes and genes. The group of blocks 120 represents a chromosome in which a plurality of CLBs have genes associated therewith. In accordance with an example embodiment, the CLBs programmed to implement the genes are referenced by row and column using the notation: CLB (1,1), CLB (1,2), . . . , CLB (2,1), CLB (2,2), . . . , CLB (n,m−1), CLB (n,m), where n is the number of rows of CLBs and m is the number of columns of CLBs.

The group of blocks 130 shows the group of genes that can evolve for programming CLB (2,1) in an example FPGA. Specifically, there are genes for evolving the F1, F2, F3, and F4 inputs to a lookup table, genes for evolving the F, G, and H lookup tables; and genes for evolving the X and Y flip-flops. It will be appreciated that additional genes can be included for evolving programming for other resources in the FPGA.

Each gene includes a sequence of bits that is translated into programming bits in the configuration bitstream. For example, the G-LUT gene is comprised of bits 140. Those skilled in the art will recognize the various gene codes that can be constructed to represent the various programming states for the respective resources, and will further recognize the manner in which the gene codes can be translated to programming bits in a configuration bitstream.

Figure 2:
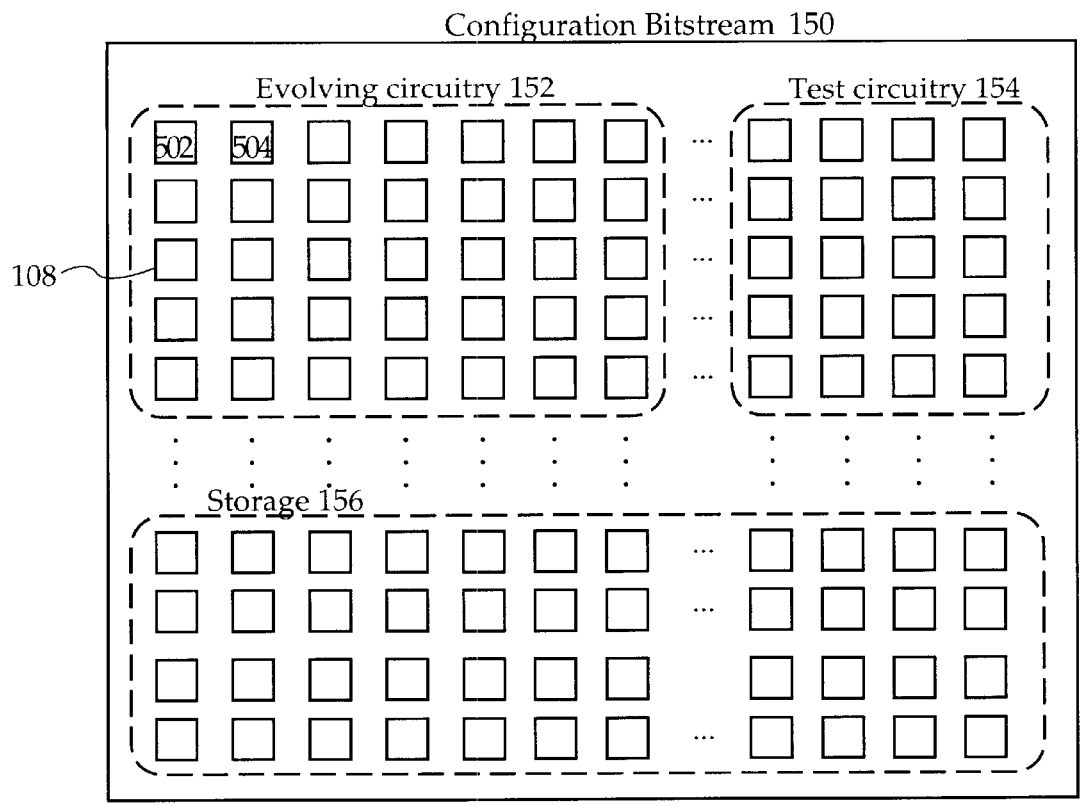
FIG. 2 is an example configuration bitstream that illustrates how an FPGA can be partitioned to support evolving circuitry as well as fixed circuitry.

FIG. 2 is an example configuration bitstream 150 that illustrates how an FPGA can be partitioned to support evolving circuitry as well as fixed circuitry. Configuration bitstream 150 is comprised of a plurality of bit sequences 108. Each of bit sequences 108 corresponds to bits used to program a respective CLB in an FPGA, for example. Configuration bitstream 150 illustrates an embodiment in which a design is evolved on a portion of an FPGA, while other portions of the FPGA are programmed, but do not evolve.

Configuration bitstream 150 includes, for example, a group of bit sequences 152 for evolving circuitry, a group of bit sequences 154 for test circuitry, and a group of bit sequences 156 for storage circuitry. Bit sequences 152 of the evolving circuitry can be evolved in accordance with the methods described herein.

Bit sequences 154 of the test circuitry implement a selected test circuit on the FPGA, and can either be static or dynamic in alternative embodiments. The test circuitry can be used to drive and/or provide an interface for the evolving circuitry. For example, the test circuitry could be configured to generate a fixed set of test vectors, or generate test stimuli in response to commands issued from another processor. Bit sequences 156 provide a storage circuit for data used by the other circuitry implemented in the FPGA.

Figure 3:
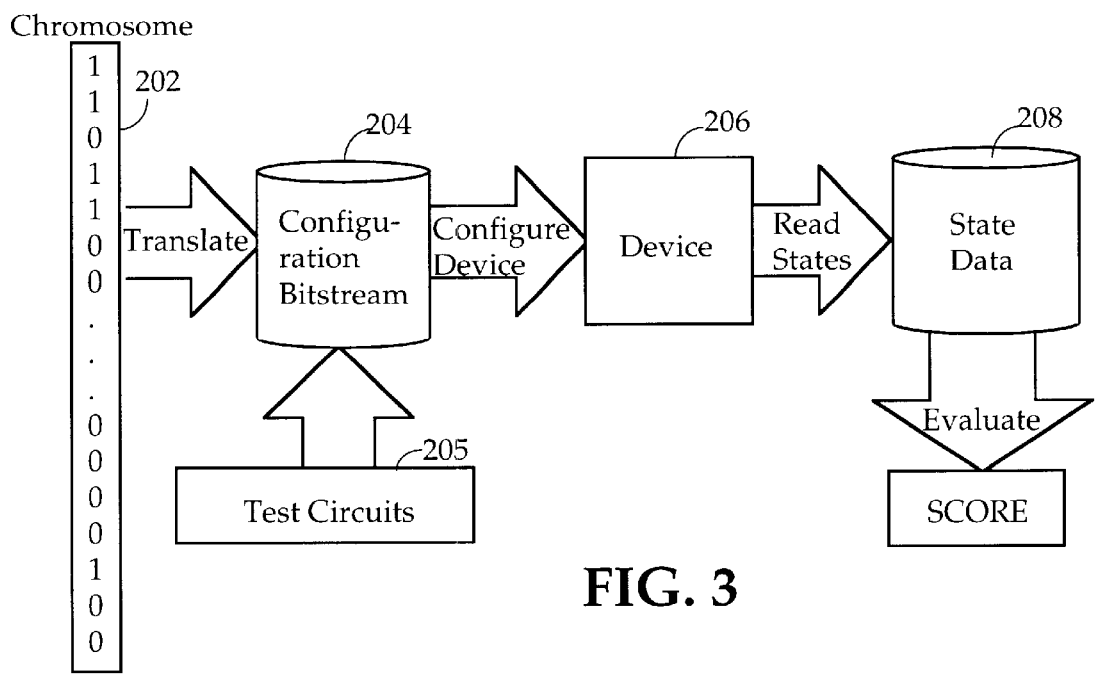
FIG. 3 is a data flow diagram showing processing of a single chromosome in accordance with an example embodiment of the invention.

FIG. 3 is a data flow diagram showing processing of a single chromosome in accordance with an example embodiment of the invention. The data flow begins with translation of chromosome 202 to configuration bitstream 204. In the example embodiment, translation of bits from chromosome 202 to configuration bitstream 204 occurs with a mapping and translation of chromosome bits to bits in configuration bitstream 204 for programming associated resources in programmable logic device 206. Test circuits are inserted into bitstream 204 to drive test data into the evolved circuit. Contention can be checked while chromosome 202 is being converted to bitstream 204 or after bitstream 204 has been generated. If contention is found, configuration bitstream 204 is modified to eliminate connections that cause contention. Test circuits 205 can also be entered into configuration bitstream 204.

Programmable logic device 206 is then configured with bits from configuration bitstream 204. Using preselected input test data, device 206 is tested and state data 208 is read from the device. It will be appreciated that state data 208 can be obtained at various stages of testing device 206. Specifically, data can be obtained from output signal pins of device 206 during testing, or alternatively, device 206 can be tested and the entire state of device 206 can be read after testing.

State data 208 is evaluated in accordance with criteria selected to provide an indication of the suitability of configuration bitstream 204 to meet predetermined requirements. For example, state data 208 can be compared to expected results data, and the suitability of the design can be assigned a score as a function of the degree of correlation between state data 208 and the expected data. Alternatively, the state data could be input to a scoring function. Chromosome 202 is assigned a score indicative of its suitability in the example embodiment.

Figure 4:
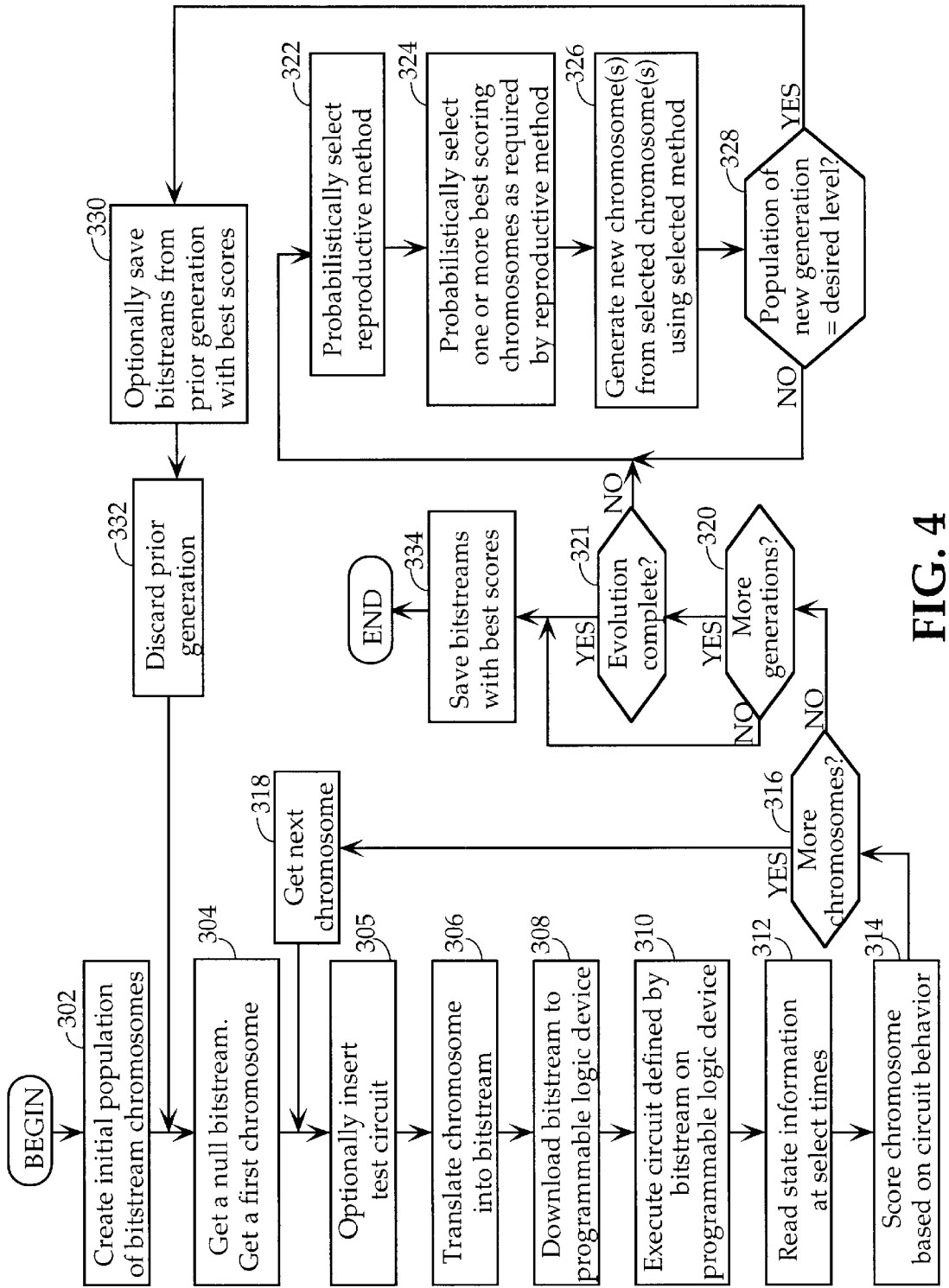
FIG. 4 is a flowchart of the processing performed in evolving a design in accordance with an example embodiment of the invention.

FIG. 4 is a flowchart of the processing performed in evolving a design in accordance with an example embodiment of the invention. The process begins, for example, with a random population of chromosomes. The initial population could, alternatively, be seeded with some chromosomes known to possess desired genes. Some known chromosomes could also be mutated to construct the initial population.

Each chromosome is processed and scored as described in the data flow diagram of FIG. 3. Based on the scores of the chromosomes, chromosomes are probabilistically selected to create a next-generation of chromosomes. Thus, chromosomes with better scores are more likely to be selected and used to create the next generation. The process is then repeated until a chromosome that meets desired requirements evolves.

At step 302, an initial population of chromosomes is created. In the example embodiment, the logic levels of the bits are pseudo-randomly generated using conventional techniques. As previously indicated, the initial population could also be seeded with selected chromosomes or have some chromosomes mutated from selected chromosomes.

At step 304, a null configuration bitstream is obtained from the user. It will be appreciated that the initial state of the configuration bitstream could assume any predetermined state that is suitable as a starting point. For example, selected resources could be preprogrammed to eliminate contentions by fixing connections such that only one driver is connected to a signal line. To prevent evolution of an asynchronous circuit, selected resources can be fixed or disabled in the configuration bitstream. The chromosome does not have genes corresponding to the preprogrammed resources, whereby circuits do not evolve to have contentions and exhibit asynchronous behavior. At step 304, a first one of the chromosomes is also selected.

At step 305, a test circuit is optionally inserted into the configuration bitstream. The test circuit can be included if it is desirable to include the test driver or some suitable interface circuitry on the same device on which the design is evolving. In an alternative embodiment, the test circuit can be the same for each generation. If the bitstream begins as a null bitstream, the test circuit must be inserted every time the bitstream is evolved. If the bitstream begins with the previous test circuit already inserted, the test circuit only needs to be inserted into the configuration bitstream once. Otherwise, the test circuit can be changed from generation to generation as desired by a user. For example, the user may use one kind of test circuit for the first 10 generations, or for as long as the tests produce a certain kind of result. Then after 10 generations, or after a certain kind of result is achieved, a more sensitive test can be used. In another embodiment, the programmable device can be configured without test circuitry. A tool like JBits can be used to construct the test circuit, or pre-constructed circuits can be placed into the bitstream by a tool like Jbits. The test circuit can be constructed so that it receives test data or even instructions from outside the device. The instructions can come, for example, from other hardware, or from software. However, if there is room, the test data can be stored right on the device in which the evolving design is located.

At step 306, the selected chromosome is translated into a configuration bitstream. As explained further in the following figures, the translation of the chromosome into a configuration bitstream is accomplished with Java-implemented mapper and translator classes (wherein the classes implement methods). The mapper methods are programmed to process the specific genes on the chromosomes, and call the translator methods for translating the genes to bits in the configuration bitstream. In the example embodiment, there is one translator method per programmable resource. For example, for a Xilinx device in the XC4000 family, there are respective translator methods for F-LUTs, G-LUTs, CLB outputs, etc.

A mapper chooses a translator that corresponds to the gene, and then the translator accesses a chromosome. Every gene has a translator. For example, there is one translator for an input to an F-LUT (one of the lookup tables in several popular Xilinx FPGAs) and another translator for the D-input to a flip flop. The mapper tells the translator which CLB subcircuit (programmable resource) is to receive the circuit specified by the gene. A CLB number indicates which CLB has the programmable resource to be updated in accordance with the chromosome. A gene location indicates the starting point of the gene. The translator invokes conventional software, such as JBITs from XILNX, to manipulate the proper bits in the configuration bitstream.

At step 308, the configuration bitstream is downloaded to the programmable logic device. The XILINX hardware interface XHWIF can be used for devices such as the XC4000 and Virtex FPGAs. Once loaded with the configuration bitstream, at step 310 the circuit implemented on the programmable logic device is exercised. Either predetermined or dynamically determined stimuli can be applied to the circuit. Conventional techniques can be used to step the clock and provide input to the device.

At step 312, state information is read at one or more selected times. Depending upon the requirements for the evolving design, the state information could also be obtained from a device external to the programmable logic device, for example, a RAM.

At step 314, the chromosome is assigned a score. Scoring a chromosome can be accomplished using conventional techniques adapted to the evolving design. For example, a scoring function could be applied to the state data to generate an associated score. Alternatively, the state data could be compared to expected data for the desired functionality, and a score assigned indicating suitability of the chromosome. Those skilled in the art will recognize that the relative merit of scores may be alternatively represented as better scores having higher values or better scores having lower value, depending on the selected scoring technique. As indicated by steps 316 and 318, the process of steps 306–314 is repeated until all the chromosomes in the population have been processed.

When all the chromosomes in the population have been evaluated, step 316 directs control to step 320 via path 316p. Steps 320–332 evolve a new generation of chromosomes. If another generation is desired, step 320 directs processing to step 321. Whether another generation is desirable can be specified, for example, with a user-supplied parameter. That is, if a suitable design does not evolve within a selected number of generations, it may be desirable to change the genetic algorithm parameters, such as the weights associated with the reproductive methods, to evolve chromosomes using the new parameters. In an alternative embodiment, the weights associated with the reproductive methods can be changed after having scored the chromosomes so that the probabilistically selected reproductive methods may vary from generation to generation.

Decision step 321 tests whether evolution of the design is complete. Whether the design has sufficiently evolved can be tested by various methods. For example, when at least one bitstream achieves a perfect score or the score passes a desired threshold, the evolution may be complete. Alternatively, averages of the scores of the bitstreams in the n prior generations may be determined and saved, and when the changes in average scores between the n prior generations and the present generation do not exceed a selected threshold, evolution of the design may be deemed complete (at least using the present population).

At step 322, a reproductive method is probabilistically selected. The reproductive methods of elitism, one-point cross-over, mutation, and copy (also called "reproduction") are used in the example embodiment. In one version, elitism is not a probabilistic reproductive method. It is either turned on or turned off. If elitism is turned on, the best scoring chromosome is copied to the next generation. Then the other individuals are selected by a probabilistic method. In one-point crossover, two chromosomes are split at a randomly selected point, and the top portions are combined with the bottom halves to create two new chromosomes for the next generation. Mutation is copying a single chromosome to the next generation and randomly complementing a bit on the chromosome. The copy method simply copies a single chromosome to the next generation without changing the chromosome.

In the example embodiment, user-configurable parameters are used to assign respective weights to the reproductive methods which are then used in the probability selection. Thus, the user can influence selection of the reproductive method and adjust the parameters as experience grows in evolving hardware for various problems.

At step 324, one or more chromosomes are probabilistically selected from the population using the scores of the chromosomes in the selection. The number of chromosomes selected depends upon the selected reproductive method. For example, an asexual reproductive method, such as a mutation, requires only one chromosome, and a sexual reproductive method such as a cross-over requires two chromosomes. According to the probabilistic selection, chromosomes having better scores are more likely to be selected. It will be appreciated, however, that it is still possible that some chromosomes having worse scores will be selected. Various conventional methods are known for probabilistically selecting members from a given population, for example, fitness proportionate selection, rank selection, and tournament selection.

At step 326, one or more new chromosomes are created using the selected reproductive method and the selected chromosomes. Steps 324 and 326 are repeated until all the population of the new generation reaches a desired level, which in various example embodiments may be smaller, the same as, or larger than the present generation. Decision step 328 directs control back to step 322 if the population of the new generation has not reached the desired level. Otherwise, control is directed to step 330.

As a user configurable option, the bitstreams having the best scores are saved at step 330, and the remainder of the present generation is discarded at step 332. The saved bitstreams may be those whose scores exceed a selected threshold, or alternatively, may be the n highest scoring bitstreams, for example. The saved bitstreams can then be further analyzed using the BoardScope tool from XILINX, which permits graphical examination a circuit's behavior. In addition, bitstreams can be analyzed in terms of how they evolve over multiple generations.

When either the desired number of generations have evolved (320), or the evolution is complete (step 321), control is directed to step 334 where the bitstreams having the best scores are saved. The designs associated with these bitstreams may then be further evaluated to determine which ones have desirable design attributes.

Figure 5:
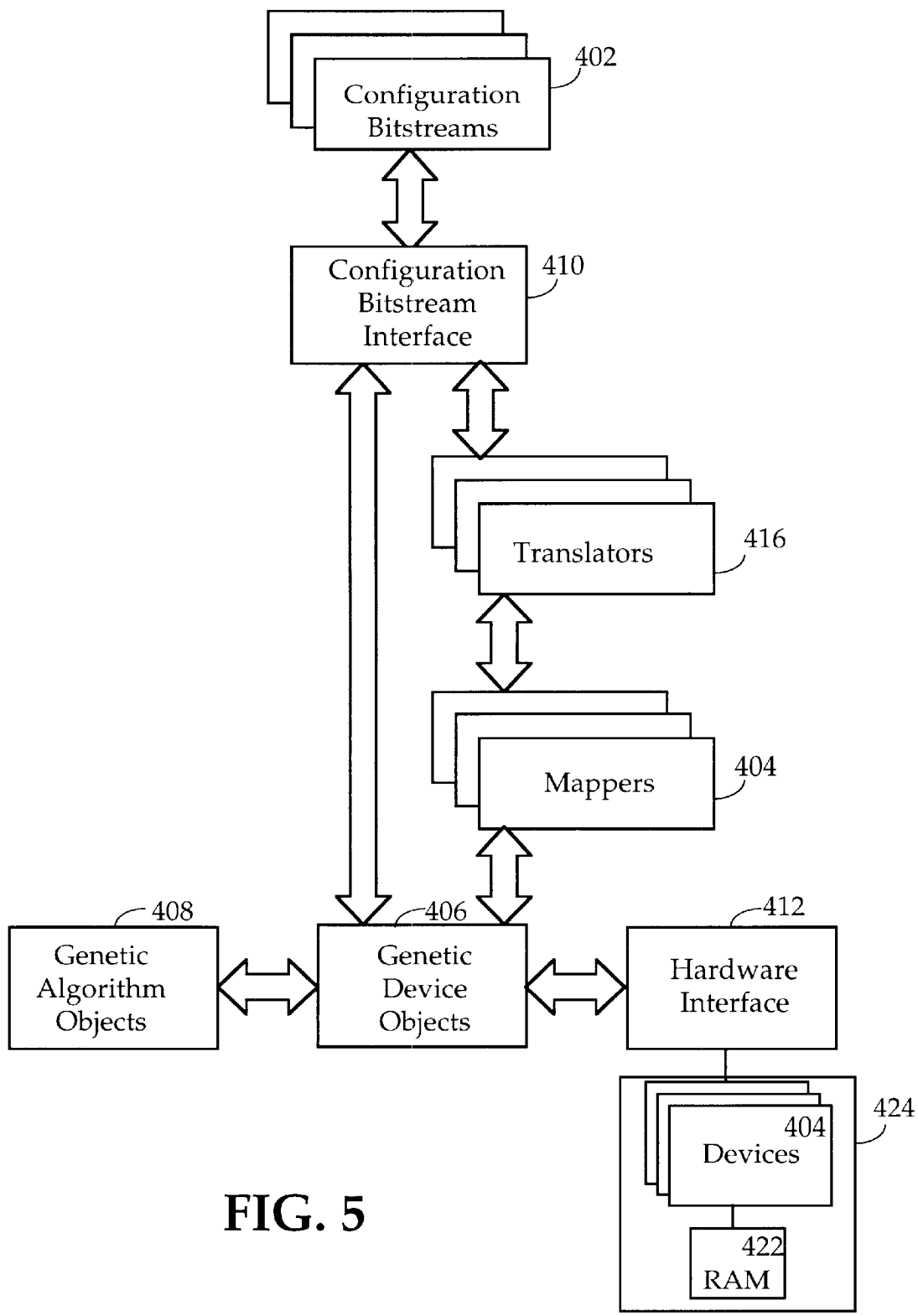
FIG. 5 is a functional block diagram of an example system for evolving a configuration bitstream.

FIG. 5 is a functional block diagram of an example system 400 for evolving a configuration bitstream. In accordance with the example embodiment, multiple configuration bitstreams 402 can be evolved in parallel for multiple programmable logic devices 404. System 400 includes genetic device objects 406, genetic algorithm objects 408, configuration bitstream interface 410, hardware interface 412, mappers 414, and translators 416.

Genetic device objects 406 and genetic algorithm objects 408 may be defined as abstract Java classes. Some of the methods defined in the classes are suitable for most problems, while others need to be customized in an inherited class.

Genetic algorithm objects 408 include a main process which is threaded, which allows multiple populations to evolve in parallel.

An evaluate() method that is defined in the genetic device class and called from genetic algorithm objects 408, evaluates the chromosomes and assigns respective scores. In defining the evaluate() method, a user specifies how the chromosomes are translated into problem-specific data structures and how these data structures are evaluated for fitness. For example, genetic device objects 406 translate the chromosomes into configuration bitstream segments and use an FPGA to determine suitability. It will be appreciated that the genetic algorithm class could be extended to solve problems in other domains, such as mechanical design problems. The reproductive methods, methods for selecting reproductive methods, and methods for selecting chromosomes are provided in the genetic algorithm classes.

Within the genetic device classes, stimulus(), score(byte bitstream[]), insertTest(byte bitstream[]), and output() functions are provided but left abstract for an inherited class to define. Software instructions used to operate the circuit are included in the stimulus() method. For example, the stimulus() method can include instructions for advancing the on-board clock, driving input vectors and controlling other resources. The stimulus can be generated from a local CPU, from a board connected to a host computer, or from a source on the Internet.

The score(byte bitstream[]) method evaluates the bitstream read back from the device and generates a score. If the state of an external device is used to measure the circuit's performance, it can be passed to the method as a byte array in place of the bitstream.

The insertTest(byte bitstream[]) method can be used to insert test circuitry into the bitstream before the bitstream is downloaded into the FPGA. This may be used, for example, where input/output blocks cannot be given stimulus data. This function can also be used to dynamically modify a built-in test circuit in the configuration bitstream. Including a test circuit in the configuration bitstream enhances portability by removing reliance on dedicated input/output pins for testing, and also speeds the testing process by eliminating the need for external test circuitry.

The output() method can be used to print and store metrics for the state of the population after each generation of chromosomes has been evaluated.

To execute a method from either of genetic algorithm objects 408 or genetic device objects 406, parameters such as the population size, chromosome length, and number of generations are first established.

The start(), suspend(), resume(), and stop() methods can then be used to control the execution flow. Because these classes are threaded, multiple instantiations of the inherited classes can be made to allow multiple populations to independently evolve in parallel on separate FPGAs in the system, including FPGAs on separate boards, even at remote sites. If most of the time in the evolution process is spent executing evolving designs on FPGAs, a microprocessor can evolve several designs in parallel with those being tested in FPGAs, and thus speed up the evolution, reducing time required to find a solution.

Genetic device objects 406 can also be configured to dynamically change the area of the device in which the programmable logic is evolving. For example, at the end of each generation, the population can be moved to another area on the same device, moved to another device on the same board, or moved to another device on a another board. In the example embodiment, origin and end row/column parameters are specified to evolve a design in a rectangular area of an FPGA. The origin specifies the lower left CLB of the area, and the end specifies the CLB in the upper right corner of the area. Mappers 414 and translators 416 use the area specifications to reference the proper bits in configuration bitstreams 402.

The method setHardware() implements the capability to change the evolving area and other hardware parameters during evolution. The inputs to the method include row and column coordinates for the origin of the area to evolve, a board identifier, and a device identifier. The method is one of genetic device objects 406 and can be invoked with each new generation. Thus, the evolving area and device can change as designs evolve. The area can change to a new location on the same device, to a new location on a different device on the same board, to a new board, or even to a remote site as long as CLBs in the new area have the same programmable resources as those in the original area. Periodically changing areas or devices further increases stability because changing reduces the chance of an anomaly affecting the evaluated result, and thus producing designs that are less susceptible to undesirable influences caused by irregularities in device fabrication, operating temperatures, operating voltages and other environmental factors. In other words, the ability to relocate evolving designs supports evolution of robust designs.

The method setHardware() also supports the capability to evolve multiple populations of configuration bitstreams in parallel. Using the device and board identifiers and parameters, the populations can evolve on separate devices. If one device is remote from another, the transfer can be made over the internet. To accomplish remote internet access requires software on a server or computer to which the remote FPGA is connected. The XHWIF software from Xilinx, Inc. is appropriate. This software enables the remote site to receive a bitstream, which configures the FPGA, and to send a readback bitstream to the originating site for evaluating evolution of this remotely evolved bitstream. When an FPGA design is being evolved on several FPGAs in parallel, it is not necessary that the various FPGAs be the same size, only that the various FPGAs have common architectural features so they will respond the same way to the same subset of a bitstream.

The above description applies to evolving test circuits as well as to evolving the designs themselves.

In the example embodiment, mappers 414 are programmed in accordance with the specific genes on the chromosome. For example, a mapper is programmed to process the genes 130 as shown in FIG. 1B. A mapper first obtains the boundaries of the area of the FPGA for which the bitstream is to evolve, for example the CLBs associated with the evolving circuitry 152 of FIG. 2. Then genes on the chromosome are processed CLB-by-CLB and appropriate translators are invoked to translate the genes to bits in the portion of the configuration bitstream for the evolving area.

Referring back to FIGS. 1B and 2, the genes associated with CLB (1,1) can be processed first and translated to configuration bits in bit sequence 502. The process continues with the genes associated with CLB (1,2) being translated to configuration bits in bit sequence 504 and so on until all the genes have been processed.

In an example embodiment, one mapper ("synchronous mapper") is provided for creating digital synchronous circuits, and another mapper ("asynchronous mapper") is provided for creating asynchronous circuits.

The synchronous mapper, in the example embodiment, is used with chromosomes in which there are no genes that can evolve to cause asynchronous behavior. If the synchronous mapper is adapted for a XILINX FPGA, for example, the chromosomes have no genes for evolving: (1) the asynchronous set/reset ports of flip-flops; (2) the clock input to flip-flops; (3) the clock enable to flip-flops; (4) the flip-flops to behave as latches; (5) CLB outputs to be driven by other than flip-flop outputs; and (6) CLB inputs to be driven by signals other than synchronous outputs. These resources are fixed in the configuration bitstream. For example, the clock inputs to all flip-flops are coupled to the same clock signal line.

The asynchronous mappers are similar to the synchronous mappers. However, the asynchronous mappers, in addition, support evolution of selected ones of the resources that the synchronous mappers do not support. For example, the asynchronous mappers support evolution of resources such as the asynchronous set/reset ports of flip-flops. The asynchronous mappers can be tailored to support evolution of all or a subset of the programmable resources that may result in asynchronous behavior.

It will be appreciated that mappers can be tailored to evolve only those programmable resources for which evolution is desirable. Thus, for example, carry logic can be allowed to evolve or not evolve, depending on the design objectives. In addition and as explained in the following paragraph, mappers could be tailored to dynamically eliminate contentions for resources.

Various methods can be defined in mappers 406 and translators 416 to prevent contention for resources such as signal lines. For example, a mapper could be configured to read the evolved configuration bitstream and examine the bitstream for contention due to several signals driving the same wire. If contention is detected, connections are changed in the configuration bitstream to eliminate the contention. Alternatively, mappers 414 can be configured to track which signal lines are connected to drivers, and to connect a driver to an available signal line instead of a connected signal line if such contention is detected in translating an input chromosome.

Figure 6:
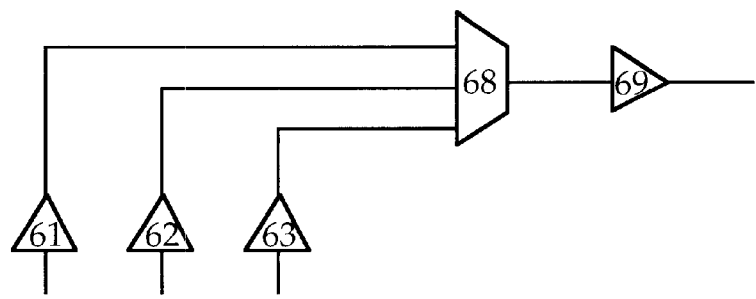
FIG. 6 shows an acceptable architecture in which contention does not occur.
Figure 7:
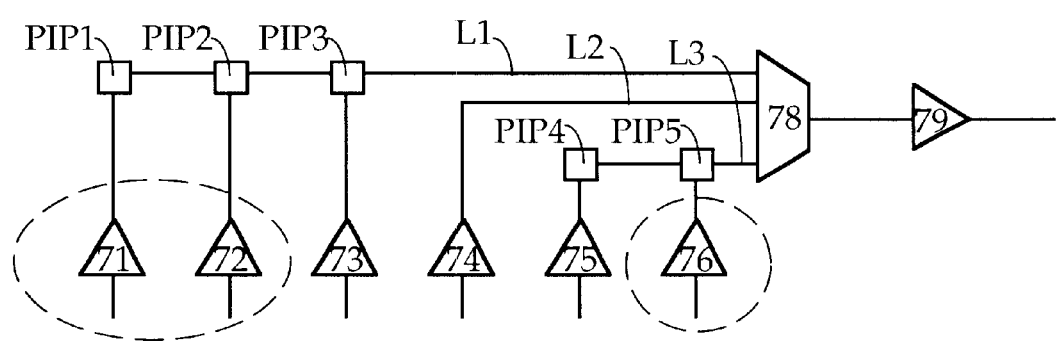
FIG. 7 shows an architecture with potential for contention.

In yet another embodiment, signal lines can be predefined in a "null" bitstream to be connected to respective single drivers, wherein the chromosomes do not have genes to evolve for the predefined connections. Connectivity, however, evolves with genes associated with programming inputs fed by the drivers. FIGS. 6 and 7 illustrate two kinds of FPGA signal line architectures. In FIG. 6, multiplexer 66 selects one of drivers 61, 62, and 63 to drive driver 69. Since no more than one driver 61–63 can be selected by a multiplexer, no contention can occur. However, in FIG. 7, there are six possible sources for a signal to apply to driver 79. And three of these, drivers 71–73, can simultaneously drive line L1. Thus, to avoid contention, software disables all but one of these drivers, driver 73 (predefines the signal line to be connected to driver 73). Similarly, since drivers 75 and 76 can both drive line L3, software predefines line L3 to be connected to driver 76 in order to avoid contention.

In another embodiment, to eliminate contention, assignments of resources (e.g., signal lines to drivers) are tracked.

When a contentious assignment is attempted, another resource is assigned. For example, in the architecture of FIG. 7, if line L1 is assigned to be driven by driver 71 and evolution suggests that a signal applied to driver 72 also drive line L1, the signal is assigned to an available signal line, for example L2, instead of to a signal line that is already assigned to another driver.

Conventional workstations can be used to host software for genetic device objects 406, genetic algorithm objects 408, mappers 414, translators 416, bitstream interface 410, and hardware interface 412. In an example embodiment, hardware interface 412 can be implemented with XHWIF from XILINX, which provides an interface to boards populated with XILINX FPGAs.

Figure 8:
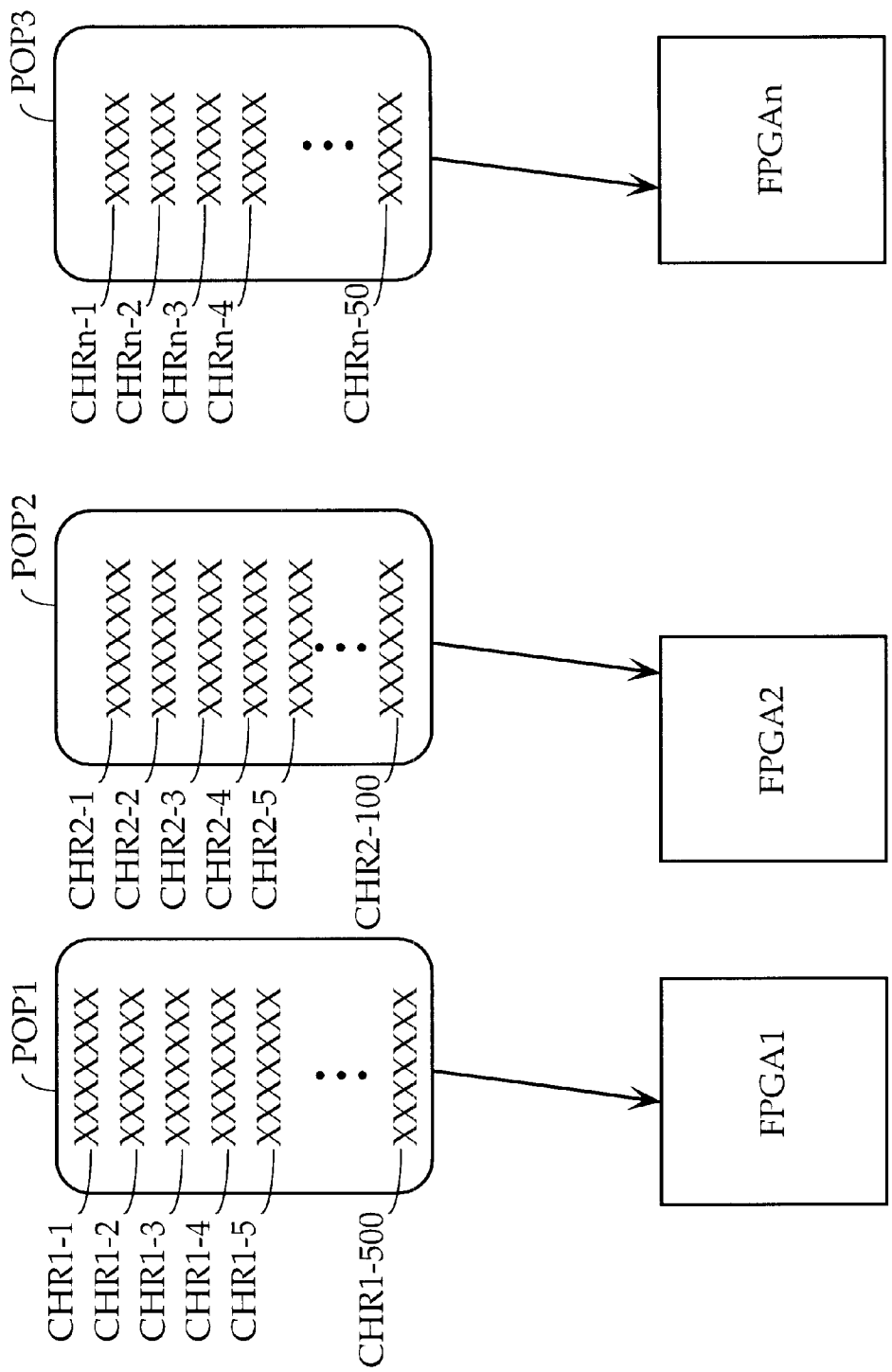
FIG. 8 shows an example in which evolution of several chromosome populations occurs on several FPGAs.

FIG. 8 is a very simple example that illustrates how the well-known programming technique of threading can be used to evolve several populations of designs concurrently. In the example of FIG. 8, three FPGAs will be used concurrently by a microprocessor to evolve three designs. In this example, FPGA1 and FPGA2 are both used to evolve a design for a first objective, for example a counter. FPGA3 is used to evolve a controller, for example. Thus the objectives against which FPGA1 and FPGA2 will be evaluated are the same, while the objective against which FPGA3 will be evaluated is different from the other two. FPGA1 and FPGA2 will be evaluated against whether a particular set of input signals produces output signals expected from a counter, while FPGA3 will be evaluated on whether its output signals match those of the desired controller.

The microprocessor evolves a first population POP1 for evaluation in FPGA1 against a counter objective. This first population includes chromosomes CHR1-1 through CHR1-500, which have been specified to use an elitism reproductive method. Thus the highest scoring chromosome will propagate to the next generation. The remaining chromosomes are chosen by a probabilistic combination of 50% one-point cross-over and 50% mutation. The probabilistic reproductive method will be chosen by a random number generator. The second population POP2 includes only 100 chromosomes CHR2_1 through CHR2-100 that will evolve using a reproductive method that has a 33% percent chance of being one-point cross-over, 33% mutation, and 34% copy. The reproductive method will again be chosen by a random number generator. Another population CHRn–1 through CHRn–50 will also evolve using a reproductive method that has 33% percent chance of being one-point cross-over, 33% mutation, and 34% copy, but of course will be evaluated differently and will therefore evolve differently. If the time required to evolve a chromosome is far less than the time required to evaluate that chromosome in the FPGA, one microprocessor can work efficiently with several FPGAs concurrently. Each evaluation is a threaded process and the process keeps up with which FPGA the thread relates to. So chromosomes from POP1, POP2, and POP3 can be running on FPGA1, FPGA2, and FPGA3, respectively while several chromosomes in POP2 are being evolved by the microprocessor concurrently. Well-known threading software is being used in a novel way to keep up with several populations and control the separate evolution of the populations in several FPGAs.

Figures 9A, 9B, 9C, 9D:
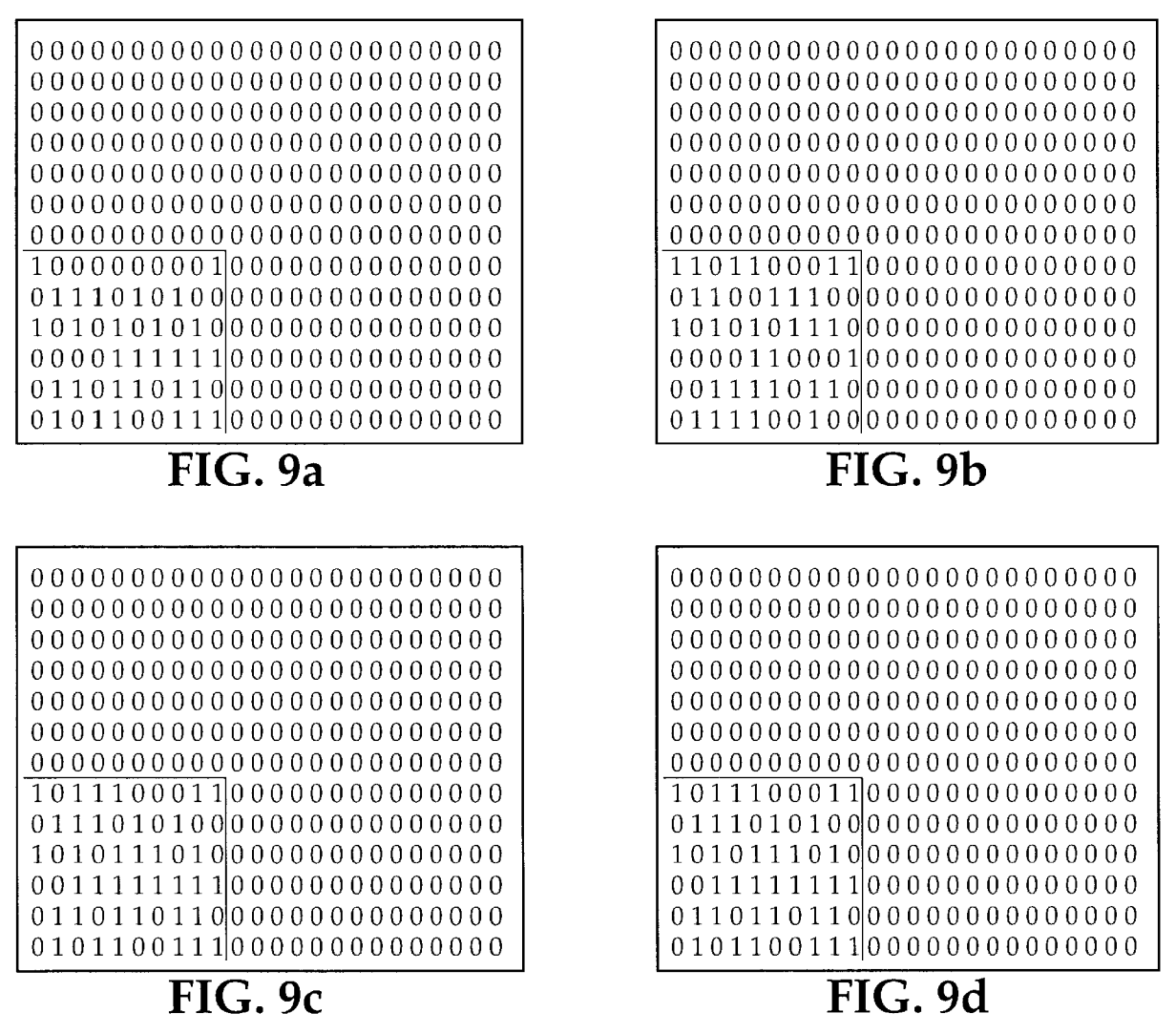

Regarding the effect of asynchronous behavior, when a bitstream has been evolved without protecting against asynchronous behavior, the same bitstream will produce different results in different FPGAs, and even in the same FPGA under different temperature and voltage conditions. This is because an asynchronous design allows for such unstable combinations as asynchronous feedback loops and gated clocks. FIGS. 9a and 9b show flip flop values that resulted in a corner area in two different FPGAs when these two FPGAs were programmed with the same bitstream that had been generated without concern for asynchronous behavior. A map of 0's and 1's represent flip flops that hold logic 0 and 1 values, respectively. It can be seen that the pattern of 0's and 1's in FIG. 9a is different from that in FIG. 9b. By contrast, FIGS. 9c and 9d show flip flop values that resulted when a bitstream generated while prohibiting asynchronous behavior was loaded into two FPGAs. It can be seen that FIGS. 9c and 9d have identical results. Thus, restraining evolution to avoid asynchronous behavior produces stable circuits that can be repeated in multiple FPGAs under different conditions.

As another novel feature, controlling evolution of the design can be done remotely as well as locally. For example, the XHWIF hardware interface includes a network interface, which supports communications, for example, via the Internet. Thus, genetic algorithm objects 408, genetic device objects 406, mappers 414, and translators 416 can operate at one seat on the network, and hardware interface 412 can be connected at another seat on the network. Genetic device objects 406 can also be configured to interact with multiple hardware interfaces connected to the network, thereby supporting evolution of multiple populations in parallel.

In another embodiment, state data is obtained from devices other than the programmable logic devices. For example, the state data can be read from RAM 422 that has stored data from programmable logic devices 404. It will also be appreciated that state data can also be obtained from devices that do not occupy the same board 424 as programmable logic devices 404. However a physical connection is required between the external devices and genetic device objects 406.

Accordingly, the present invention provides, among other aspects, a system and method for evolving configuration bitstreams. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for evolving configuration bitstreams for a programmable logic device, comprising:
   providing a test circuit to be implemented on the programmable logic device;
   creating a population of configuration bitstreams, each bitstream implementing the test circuit and having a selected portion that is evolvable; and
   evolving respective selected portions of the configuration bitstreams until at least one predetermined criterion is met.

2. The method of claim 1, wherein the test circuit implements a memory.

3. The method of claim 1, wherein the test circuit implements a memory and a circuit for providing test vectors to the evolved portions of the bitstreams.

4. The method of claim 3, wherein data used by the test vectors are stored in the test circuit.

5. The method of claim 3, wherein data used by the test vectors are stored in another device.

6. The method of claim 3, wherein data and instructions used by the test circuit are stored in another device.

7. The method of claim 3, wherein instructions used by the test circuit are generated by another evolved bitstream.

8. The method of claim 1, further comprising selectively changing the test circuit with each new generation of configuration bitstreams.

9. The method of claim 1, further comprising selectively changing the test circuit with each new configuration bitstream.

10. The method of claim 1, further comprising evolving the selected portions of the configuration bitstreams using a plurality of reproductive methods.

11. The method of claim 10, further comprising:

assigning respective weight values to the reproductive methods; and probabilistically selecting the reproductive methods in accordance with the respective weight values.

12. The method of claim 11, wherein the reproductive methods include elitism, mutation, cross-over, and copy.

13. A method for evolving configuration bitstreams for a programmable logic device, comprising:

providing a test circuit to be implemented on the programmable logic device;

establishing chromosome data structures having data associated with programming resources of the programmable logic device;

creating respective configuration bitstreams from data of the chromosome data structures and the test circuit;

evaluating the respective configuration bitstreams that include the test circuit for relative suitability to meet predetermined criteria when deployed on a programmable logic device;

evolving data in the chromosome data structures based on the relative suitability; and repeating the steps of creating, evaluating, and evolving until at least one predetermined criterion is met.

14. The method of claim 13, further comprising selectively changing the test circuit with each new generation of chromosome data structures.

15. The method of claim 13, further comprising selectively changing the test circuit with each new chromosome data structure.

16. The method of claim 13, further comprising:

programming a first set of resources of the device;

wherein the data of the chromosome data structures are comprised of gene codes associated with a second set of programmable resources of the device, wherein the first set of resources is different from the second set of resources.

17. The method of claim 13, wherein the test circuit implements a memory and a circuit for providing test vectors.

18. The method of claim 13, further comprising evolving data in the chromosome data structures using a plurality of reproductive methods.

19. The method of claim 18, further comprising:

assigning respective weight values to the reproductive methods; and probabilistically selecting the reproductive methods in accordance with the respective weight values.

20. The method of claim 18, wherein the reproductive methods include elitism, mutation, cross-over, and copy.

21. An apparatus for evolving configuration bitstreams for a programmable logic device, comprising:

means for providing a test circuit to be implemented on the programmable logic device;

means for establishing chromosome data structures having data associated with programming resources of the programmable logic device;

means for creating respective configuration bitstreams from data of the chromosome data structures and the test circuit;

means for evaluating the respective configuration bitstreams that include the test circuit for relative suitability to meet predetermined criteria when deployed on a programmable logic device; and means for evolving data in the chromosome data structures based on the relative suitability until at least one predetermined criterion is met.

22. A method for evolving configuration bitstreams for a programmable logic device, comprising:

creating respective configuration bitstreams on a data processing system;

downloading the configuration bitstreams from the data processing system to the device, where the device is at a location remote from the data processing system;

operating the device using the bitstream downloaded to the device;

reading back data from the device to the data processing system; and evolving the configuration bitstreams until at least one predetermined criterion is met.

23. An apparatus for evolving configuration bitstreams for a programmable logic device, comprising:

means for establishing chromosome data structures having data associated with programming resources of an area of the programmable logic device;

means for creating respective configuration bitstreams from data of the chromosome data structures;

means for evolving data in the chromosome data structures based on relative suitability until at least one predetermined criterion is met;

means for downloading the configuration bitstreams to the device via a network; and means for evaluating the respective configuration bitstreams for relative suitability to meet predetermined criteria when deployed on a programmable logic device.

* * * * *